US008736155B2

(12) United States Patent  
Jeon et al.

(10) Patent No.: US 8,736,155 B2
(45) Date of Patent: May 27, 2014

(54) ORGANIC LIGHT-EMITTING DISPLAY APPARATUS

(75) Inventors: Hee-Chul Jeon, Yongin (KR); Sung-Joo Hwang, Yongin (KR); Ji-Eun Kim, Yongin (KR); Sea-Hee Lim, Yongin (KR); Jang-Kyu Yim, Yongin (KR); Jeong-Yeol Lee, Yongin (KR); Sun-Youl Lee, Yongin (KR); Kwang-Sik Lee, Yongin (KR); Byung-Uk Han, Yongin (KR); Sang-Min Hong, Yongin (KR); Jung-I Yun, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 490 days.

(21) Appl. No.: 13/029,765

(22) Filed: Feb. 17, 2011

(65) Prior Publication Data
US 2011/0221332 A1 Sep. 15, 2011

(30) Foreign Application Priority Data

Mar. 9, 2010 (KR) .................. 10-2010-0021012

(51) Int. Cl.
H05B 33/10 (2006.01)
(52) U.S. Cl.
USPC ........................................ 313/504
(58) Field of Classification Search
USPC .............................. 313/498–512
See application file for complete search history.

(56) References Cited

U.S. PATENT DOCUMENTS

| 6,366,025 | B1 | 4/2002 | Yamada |
| 2006/0267913 | A1* | 11/2006 | Mochizuki et al. ........... 345/100 |
| 2007/0103491 | A1* | 5/2007 | Moriya et al. ................ 345/694 |
| 2008/0197770 | A1 | 8/2008 | Choi et al. |
| 2009/0305461 | A1* | 12/2009 | Akimoto et al. .............. 438/104 |

FOREIGN PATENT DOCUMENTS

| JP | 2000-235891 | 8/2000 |
| JP | 2005-166691 | 6/2005 |
| JP | 2007-017478 | 1/2007 |
| KR | 10-2003-0024076 | 3/2003 |
| KR | 10-2006-0088682 | 8/2006 |
| KR | 10-2007-0042483 | 4/2007 |
| KR | 10-2007-0050796 | 5/2007 |
| KR | 10-2009-00855985 | 6/2009 |

OTHER PUBLICATIONS

KIPO Registration Determineation Certificate dated Nov. 14, 2011, for Korean priority Patent application 10-2010-0021012, noting listed references in this IDS, 5 pages.

* cited by examiner

Primary Examiner — Anh Mai
Assistant Examiner — Brenitra M Lee
(74) Attorney, Agent, or Firm — Christie, Parker & Hale, LLP

(57) ABSTRACT

An organic light-emitting display apparatus including first and second edge sub-pixel lines disposed at opposing side edges of the apparatus and center sub-pixel lines disposed therebetween, each for emitting a single color of light. An external emission width of the first edge sub-pixel line is less than an external emission width of the center sub-pixel lines that emit the same color. An external emission width of the second edge sub-pixel line is less than the width of the center sub-pixel lines that emit the same color.

21 Claims, 8 Drawing Sheets

ORGANIC LIGHT-EMITTING DISPLAY APPARATUS

CROSS-REFERENCE TO RELATED APPLICATION

This application claims the benefit of Korean Patent Application No. 10-2010-0021012, filed on Mar. 9, 2010, in the Korean Intellectual Property Office, the disclosure of which is incorporated herein, by reference.

BACKGROUND

1. Field

Aspects of the present invention relate to an organic light-emitting display apparatus having improved picture quality characteristics.

2. Description of the Related Art

A recent trend has been the replacement of conventional display apparatuses with thin, flat display apparatuses that are portable. Of these thin, flat display apparatuses, organic or inorganic light-emitting display apparatuses, which are self-luminescent apparatuses, have wide viewing angles, excellent contrast, and high response speeds. Thus, thin, flat display apparatuses are being regarded with much interest as next-generation display apparatuses. The organic light-emitting display apparatuses, which include light-emitting layers formed of organic materials, have a lower driving voltage, faster response speed, and produce more colors than the inorganic light-emitting display apparatuses.

An organic light-emitting display apparatus includes a cathode electrode, an anode electrode, and an organic light-emitting layer disposed therebetween. When a voltage is applied to the electrodes, the organic light-emitting layer, which is electrically connected to the electrodes, emits visible light.

Such an organic light-emitting display apparatus includes a plurality of sub-pixels that are arrayed in stripe patterns to facilitate manufacturing and improve optical characteristics. In this case, a plurality of sub-pixels arrayed in one stripe pattern may emit visible light of the same color, and sub-pixels in stripe patterns disposed at the left and right sides from a user's perspective may be more prominently perceived by the user. Thus, this arrangement limits the margin for improvement in picture quality of organic light-emitting display apparatuses.

SUMMARY

Aspects of the present invention provide an organic light-emitting display apparatus having improved picture quality characteristics.

According to an aspect of the present invention, there is provided an organic light-emitting display apparatus having edge portions and a center portion disposed therebetween, the apparatus comprising: first and second edge sub-pixel lines disposed in the edge portions, and center sub-pixel lines disposed in the center portion. The sub-pixel lines each emit a single color of light. An external emission width of the first edge sub-pixel line, which is a width, is less than the width of the center sub-pixel lines that emit the same color light as the first edge sub-pixel line, and an external emission width of the second edge sub-pixel line is less than a width of the center sub-pixel lines that emit the same color light as that of the second edge sub-pixel line.

According to various embodiments, the first edge sub-pixel line may include a plurality of sub-pixels arrayed in a longitudinal direction, the second edge sub-pixel line may include a plurality of sub-pixels arrayed in the longitudinal direction, and the center sub-pixel line may include a plurality of sub-pixels arrayed in the longitudinal.

According to various embodiments, the edge and center sub-pixel lines may be disposed on a substrate. The center sub-pixel lines each may include: a pixel electrode; a middle layer electrically connected to the pixel electrode and including an organic light-emitting layer; and a portion of an opposite electrode disposed on the middle layer. A pixel-defining film covering the first and second edge sub-pixel lines and the center sub-pixel lines, and having a plurality of openings, is formed on the pixel electrode. The middle layers contact the pixel electrodes through the openings. The openings correspond to the first and second edge sub-pixel lines and the center sub-pixel lines, respectively. A width of the openings corresponding to the first edge sub-pixel line is less than a width of the openings corresponding to the center sub-pixel line of the same color, and a width of the openings corresponding to the second edge sub-pixel line is less than a width of the openings corresponding to the center sub-pixel line of the same color.

According to various embodiments, light-blocking layers partially cover the edge portions.

According to various embodiments, the light-blocking layers may be formed in a line pattern in a longitudinal direction of the edge portions.

According to various embodiments, the light-blocking layers may cover an outermost side edges of the first and second edge sub-pixel lines.

According to various embodiments, an auxiliary electrode layer is formed on the opposite electrode, is disposed on a region corresponding to the edge portions, and has a predetermined width to overlap a predetermined region of the edge portions.

According to various embodiments, the auxiliary electrode layer may include a light blocking material.

According to various embodiments, the auxiliary electrode layer may be formed in a line pattern in a longitudinal direction of the edge portions.

According to various embodiments, the auxiliary electrode layer may cover an outermost side edges of the first and second edge sub-pixel lines from the central portion.

According to various embodiments, the edge portions and the central portion may be disposed between a substrate and a sealing member, the substrate may be attached to the sealing member with a sealing material, and the sealing material may overlap a predetermined region of the edge portions.

According to various embodiments, the sealing material may include a light blocking material.

According to various embodiments, the sealing material may be formed in a line pattern, in a longitudinal direction of the edge portions.

According to various embodiments, the sealing material may cover an outermost side edges of the first and second edge sub-pixel lines from the central portion.

According to various embodiments, first polarization members and a second polarization member, may be formed on the sealing member. The first polarization members may overlap predetermined regions of the edge portions. The second polarization member may be formed in the rest of the polarization member. The first polarization members may have less light transmissivity than the second polarization member.

According to various embodiments, the first polarization members may include a light blocking material.

According to various embodiments, the first polarization members may be formed in a line pattern, in a longitudinal direction of the edge portions.

According to various embodiments, the first polarization members may overlap outermost side edges of the first and second edge sub-pixel lines.

According to various embodiments, the substrate and the sealing member may be reinforced by a bezel, and the bezel may include protrusions covering portions of the edge portions.

According to various embodiments, the protrusions may be formed in a line pattern, in a longitudinal direction of the edge portions.

According to various embodiments, the protrusion may cover outermost side edge of the first and second edge sub-pixel lines.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
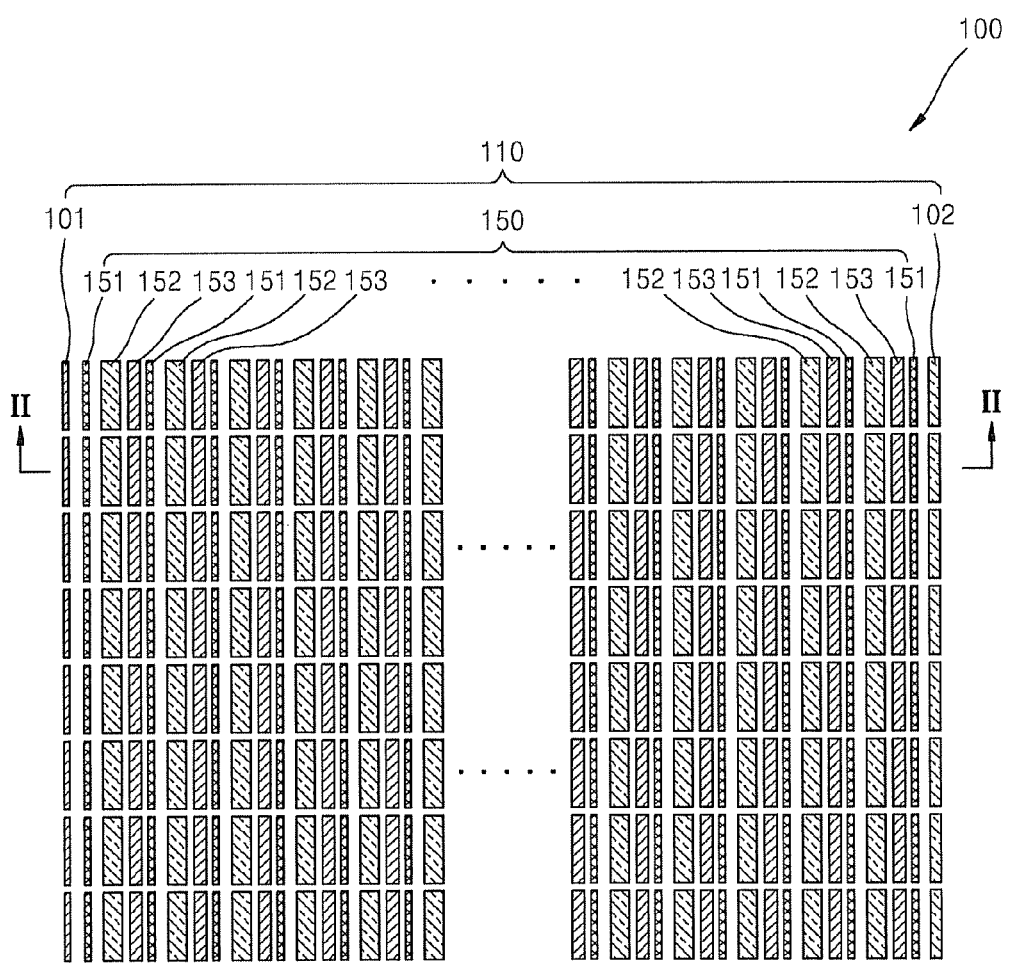
FIG. 1 illustrates a plan view of an organic light-emitting display apparatus, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In addition, when a first element is described as being "connected to" a second element, the first element may be directly connected to the second element, or may be indirectly connected to the second element, via one or more intervening elements.

Figure 2:
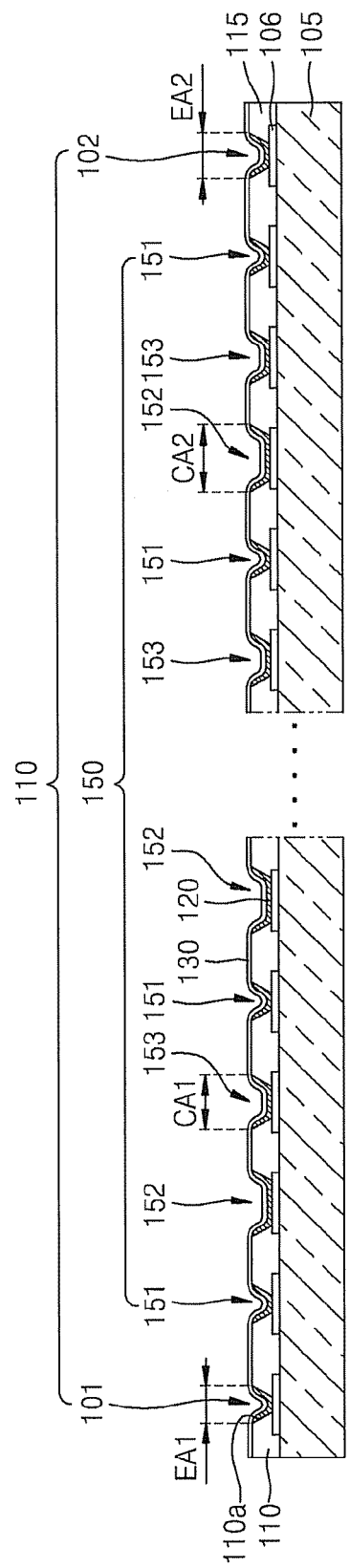
FIG. 2 illustrates a cross-sectional view taken along line II-II of FIG. 1.

FIG. 1 illustrates a plan view of an organic light-emitting display apparatus 100, according to an exemplary embodiment of the present invention. FIG. 2 illustrates a cross-sectional view taken along line II-II of FIG. 1. Referring to FIG. 1, the organic light-emitting display apparatus 100 includes edge portions 110 and a central portion 150.

The edge portions 110 include a first edge sub-pixel line 101 and a second edge sub-pixel line 102. The central portion 150 is disposed between the first and second edge sub-pixel lines 101 and 102.

In detail, the first and second edge sub-pixel lines 101 and 102 are disposed at opposing side edges of the display apparatus 100, from a user's perspective. That is, when a user sees the first and second edge sub-pixel lines 101 and 102, the first edge sub-pixel line 101 is disposed at the left edge, and the second edge sub-pixel line 102 is disposed at the right edge. The first and second edge sub-pixel lines 101 and 102 each include a plurality of sub-pixels.

The central portion 150 includes a plurality of sub-pixel lines, and particularly, may include a first center sub-pixel line 151, a second center sub-pixel line 152, and a third center sub-pixel line 153, which may be sequentially repeated in the stated order. Thus, a plurality of the first, second, and third center sub-pixel lines 151, 152, and 153 may be provided in the central portion 150.

The first and second edge sub-pixel lines 101 and 102, and the first, second, and third center sub-pixel lines 151, 152, and 153 may emit visible light of different colors. For example, the first edge sub-pixel line 101 may include red sub-pixels, the first center sub-pixel lines 151 may include green sub-pixels, the second center sub-pixel lines 152 may include blue sub-pixels, the third center sub-pixel lines 153 may include red sub-pixels, and the second edge sub-pixel line 102 may include blue sub-pixels.

Referring to FIGS. 1 and 2, the first, second, and third center sub-pixel lines 151, 152, and 153 have widths corresponding to colors thereof. That is, the widths of the first center sub-pixel lines 151 including the green sub-pixels are identical, the widths of the second center sub-pixel lines 152 including the blue sub-pixels are identical, and the widths of the third center sub-pixel lines 153, including the red sub-pixels are identical. These widths may be different or the same. For example, the blue sub-pixels may be wider than the red sub-pixels, and the red-sub-pixels may be wider than the green sub-pixels, but the present invention is not limited thereto.

The first edge sub-pixel line 101 and the third center sub-pixel lines 153 both include red sub-pixels that produce the same red light. However, the width of the first edge sub-pixel line 101 is less than that of the third center sub-pixel lines 153.

The second edge sub-pixel line 102 and the second center sub-pixel lines 152 include blue sub-pixels that produce the same blue light. However, the width of the second edge sub-pixel line 102 is less than that of the second center sub-pixel lines 152.

The above-described configuration will now be described in detail with reference to FIG. 2. Referring to FIG. 2, the organic light-emitting display apparatus 100 includes a substrate 105, pixel electrodes 106, middle layers 120, a pixel-defining film 115, and an opposite electrode 130. The first and second edge sub-pixel lines 101 and 102. The first, second, and third center sub-pixel lines 151, 152, and 153 are disposed on the substrate 105. The first and second edge sub-pixel lines 101 and 102, and the first, second, and third center sub-pixel lines 151, 152, and 153 each include the pixel electrode 106, the middle layer 120, and the opposite electrode 130.

The pixel-defining film 115 has a plurality of openings 110a to expose predetermined regions of the pixel electrodes 106. The openings 110a correspond to the first and second edge sub-pixel lines 101 and 102, and the first, second, and third center sub-pixel lines 151, 152, and 153, respectively.

The substrate 105, the pixel electrodes 106, the middle layers 120, the pixel-defining film 115, and the opposite electrode 130 will now be described in detail. The substrate 105 may be formed of a transparent glass that includes $SiO_2$ as a main component. However, the present invention is not limited thereto. For example, the substrate 105 may be formed of transparent plastic or the like. The transparent plastic may be formed of one selected from the group consisting of polyethersulphone (PES), polyacrylate (PAR), polyetherimide (PEI), polyethylene napthalate (PEN), polyethyelene-terepthalate (PET), polyphenylene sulfide (PPS), polyallylate, polyimide, polycarbonate (PC), tri acetate cellulose (TAC), and cellulose acetate propionate (CAP), which are electrically insulating organic materials.

Alternatively, the substrate 105 may be formed of metal. In this case, the substrate 105 may be formed of at least one selected from the group consisting of carbon, iron, chrome, manganese, nickel, titanium, molybdenum, SUS (stainless steel according to Japanese Industrial Standards), Invar alloy, Inconel alloy, and Kovar alloy, but the present invention is not limited thereto. The substrate 105 may be formed of a metal foil.

A buffer layer (not shown) may be formed on the substrate 105 to planarize an upper surface of the substrate 105 and prevent the permeation of impurities. The buffer layer may be formed of at least one of $SiO_2$ and $SiN_x$.

The pixel electrodes 106 may be formed on the substrate 105. Thin film transistors (not shown) may be formed on the substrate 105, before the pixel electrodes 106 are formed. The organic light-emitting display apparatus 100 may be either an active driving-type apparatus or a passive driving-type apparatus.

The pixel-defining film 115 is formed on the pixel electrodes 106. The pixel-defining film 115 has the openings 110a to expose the pixel electrodes 106. The pixel-defining film 115 may be formed of an organic or inorganic material.

The middle layers 120, which include organic light-emitting layers, are formed in the openings 110a. In detail, the middle layer 120 formed in the first edge sub-pixel line 101 includes an organic light-emitting layer that emits red light. The middle layers 120 formed in the first center sub-pixel lines 151 include organic light-emitting layers that emit green light. The middle layers 120 formed in the second center sub-pixel lines 152 include organic light-emitting layers that emit blue light. The middle layers 120 formed in the third center sub-pixel lines 153 include organic light-emitting layers that emit red light. The middle layer 120 formed in the second edge sub-pixel line 102 includes an organic light-emitting layer that emits blue light.

The opposite electrode 130 is formed on upper portions of the middle layers 120. The opposite electrode 130 may cover the first and second edge sub-pixel lines 101 and 102, and the first, second, and third center sub-pixel lines 151, 152, and 153.

Referring to FIG. 2, the openings 110a have widths corresponding to the widths of the first and second edge sub-pixel lines 101 and 102, and the widths of the first, second, and third center sub-pixel lines 151, 152, and 153. That is, a width EA1 of the openings 110a corresponding to the first edge sub-pixel line 101 is less than a width CA1 of the openings 110a corresponding to the third center sub-pixel line 153. A width EA2 of the openings 110a corresponding to the second edge sub-pixel line 102 is less than a width CA2 of the openings 110a corresponding to the second center sub-pixel lines 152. In other words, the widths EA1, EA2, CA1, and CA2 may also be referred to as the widths of the sub-pixel lines including the corresponding sub-pixels.

Herein, an "external emission width" refers to the widthwise distance along which light is emitted from a sub-pixel line and transmitted out of the display apparatus. Since light is emitted out of the display apparatus 100, along the entire widths of the sub-pixels, the widths of the sub-pixel lines 101, 102, and 151-153 may also be referred to as external emission widths. However, as disclosed below, an external emission width of a sub-pixel line may not be the same as the width thereof, if a sub-pixel line is covered with a light-blocking material.

The widths of the openings 110a may be modified to easily adjust the widths of the sub-pixels of the edge portions 110 and the central portion 150. That is, the width of the first edge sub-pixel line 101 including the red sub-pixels may be less than the width of the third center sub-pixel lines 153 including the red sub-pixels. The width of the second edge sub-pixel line 102 including the blue sub-pixels may be less than the width of the second center sub-pixel lines 152 including the blue sub-pixels.

A sealing member (not shown) may cover the substrate 105, that is, may be disposed on the upper surface of the opposite electrode 130. The sealing member, which protects the organic light-emitting layers from external moisture and/or oxygen, is formed of a transparent material. To this end, the sealing member may be formed of glass or plastic, or may be formed of stacked organic and/or inorganic materials.

In a conventional organic light-emitting display apparatus that includes sub-pixels that are arrayed in stripe patterns, sub-pixel patterns that are disposed at the left and right edges are perceived as lines by a user, which is a defect that degrades picture quality of an organic light-emitting display apparatus.

However, according to the present exemplary embodiment, the width of the first edge sub-pixel line 101 that is disposed at the left edge from a user's perspective is less than the width of the third center sub-pixel lines 153 that emit the same color as the first edge sub-pixel line 101. In addition, the width of the second edge sub-pixel line 102 that is disposed at the right edge is less than the width of the second center sub-pixel lines 152 that emit the same color as the second edge sub-pixel line 102. Accordingly, defects such as lines perceived at the left and right edges are prevented, thereby improving the picture quality of the organic light-emitting display apparatus 100.

In addition, according to the present embodiment, the widths of the openings 110a of the pixel-defining film 115 are adjustable, and the middle layers 120 are formed in the openings 110a. Thus, the widths of the middle layers 120 are determined according to the widths of the openings 110a. Accordingly, a process of forming the width of the first edge sub-pixel line 101 and the width of the second edge sub-pixel line 102 to be less than widths of the corresponding third center sub-pixel lines 153 and the second center sub-pixel lines 152, respectively, is efficiently performed.

Figure 3:
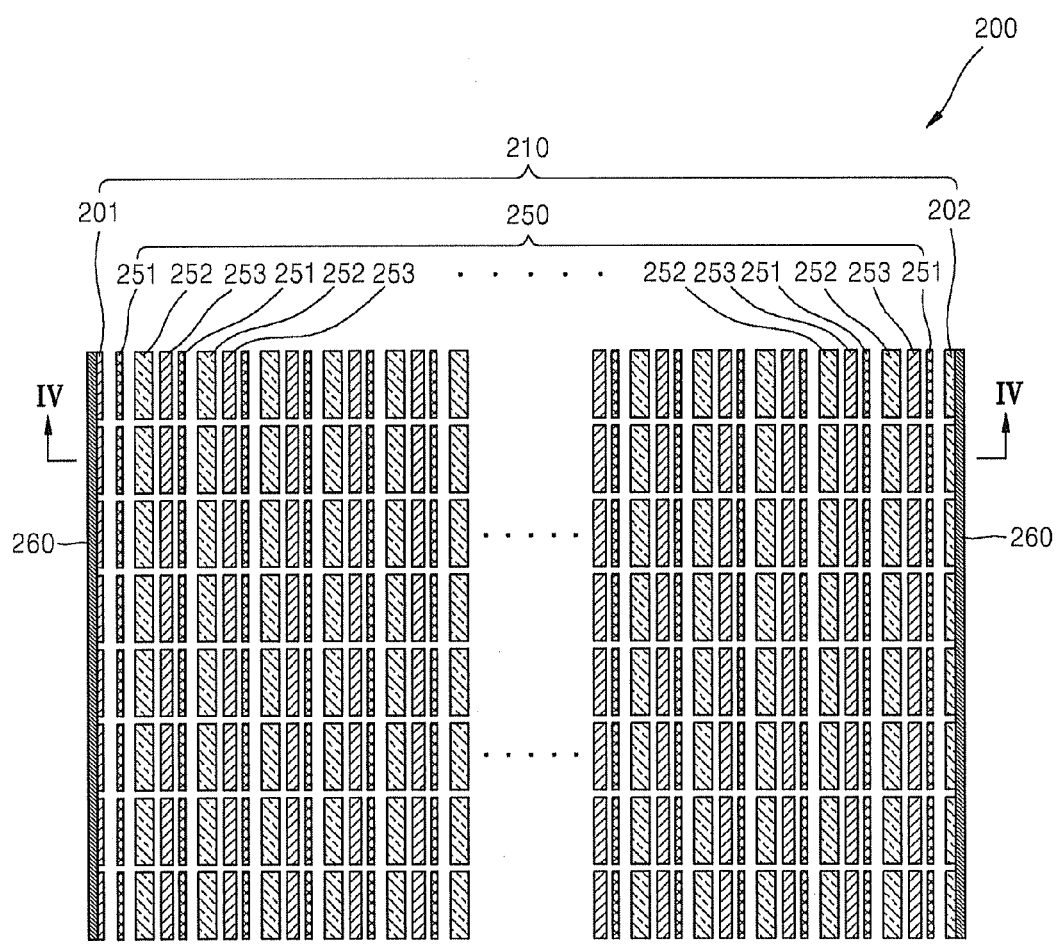
FIG. 3 illustrates a plan view of an organic light-emitting display apparatus, according to another exemplary embodiment of the present invention.
Figure 4:
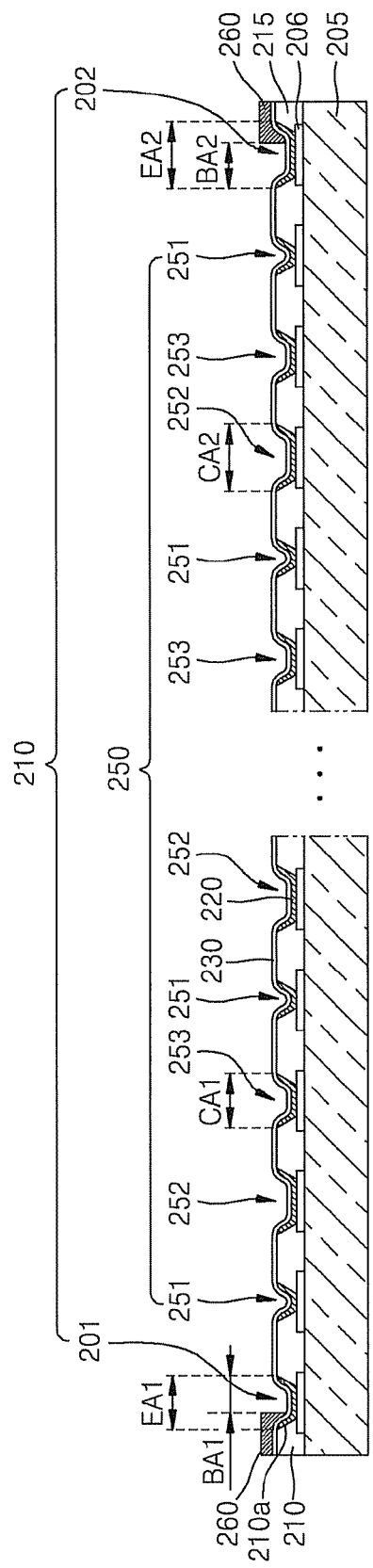
FIG. 4 illustrates a cross-sectional view taken along line of FIG. 3.

FIG. 3 illustrates a plan view of an organic light-emitting display apparatus 200, according to another exemplary embodiment of the present invention. FIG. 4 illustrates a cross-sectional view taken along line of FIG. 3. For convenience, elements different from those of the first previous embodiment will be principally described.

Referring to FIG. 3, the organic light-emitting display apparatus 200 includes edge portions 210 and a central portion 250. The edge portions 210 each include light-blocking layers 260 having a predetermined width.

The edge portions 210 include a first edge sub-pixel line 201 and a second edge sub-pixel line 202. The central portion 250 is disposed between the first and second edge sub-pixel lines 201 and 202.

In detail, the first and second edge sub-pixel lines 201 and 202 are disposed at opposing sides of the display apparatus 200, from a user perspective. That is, when a user sees the first and second edge sub-pixel lines 201 and 202, the first edge sub-pixel line 201 is disposed at the left edge, and the second edge sub-pixel line 202 is disposed at the right edge. The first and second edge sub-pixel lines 201 and 202 each include a plurality of sub-pixels.

The central portion 250 includes a plurality of sub-pixel lines, and particularly, may include a first center sub-pixel line 251, a second center sub-pixel line 252, and a third center sub-pixel line 253, which may be sequentially repeated in the stated order. Thus, a plurality of the first, second, and third center sub-pixel lines 251, 252, and 253 may be provided in the central portion 250.

The first and second edge sub-pixel lines 201 and 202, and the first, second, and third center sub-pixel lines 251, 252, and 253 each may include sub-pixels of the same color. In detail, the first edge sub-pixel line 201 includes red sub-pixels, the first center sub-pixel lines 251 include green sub-pixels, the second center sub-pixel lines 252 include blue sub-pixels, the third center sub-pixel lines 253 include red sub-pixels, and the second edge sub-pixel line 202 includes blue sub-pixels.

As shown in FIGS. 3 and 4, sub-pixel lines having the same color in the central portion 250 have the same width. That is, the first center sub-pixel lines 251 have the same width, the second center sub-pixel lines 252 have the same width, and the third center sub-pixel lines 253 have the same width.

As illustrated in FIG. 3, when a user sees the organic light-emitting display apparatus 200, the user perceives that the width of the first edge sub-pixel line 201 is less than the width of the third center sub-pixel lines 253, and the width of the second edge sub-pixel line 202 is less than the width of the second center sub-pixel lines 252. In other words, the external emission widths of the edge sub-pixel lines 210 and 202 is less than the corresponding center sub-pixel lines 253 and 252.

The above-described configuration will now be described in detail with reference to FIG. 4. Referring to FIG. 4, the organic light-emitting display apparatus 200 includes a substrate 205, pixel electrodes 206, middle layers 220, an opposite electrode 230, and the light-blocking layers 260.

The pixel electrodes 206 are formed on the substrate 205. A pixel-defining film 215 is formed on the pixel electrodes 206, and has a plurality of openings 210a to expose predetermined regions of the pixel electrodes 206. The pixel-defining film 215 may be formed of an organic material or an inorganic material.

The middle layers 220 are formed in the openings 210a. The middle layers 220 include an organic emissive layer. In detail, the middle layer 220 is formed in the first edge sub-pixel line 201 and includes an organic light-emitting layer that emits red light. The middle layers 220 formed in the first center sub-pixel lines 251 include organic light-emitting layers that emit green light. The middle layers 220 formed in the second center sub-pixel lines 252 include organic light-emitting layers that emit blue light. The middle layers 220 formed in the third center sub-pixel lines 253 include organic light-emitting layers that emit red light. The middle layer 220 formed in the second edge sub-pixel line 202 includes an organic light-emitting layer that emits blue light.

The opposite electrode 230 is formed on upper multiple surfaces of the middle layers 220. The opposite electrode 230 may cover the first and second edge sub-pixel lines 201 and 202, and the first, second, and third center sub-pixel lines 251, 252, and 253.

The light-blocking layers 260 are formed on the opposite electrode 230, on the upper surfaces of the first and second edge sub-pixel lines 201 and 202. The light-blocking layers 260 cover a predetermined width of the first and second edge sub-pixel lines 201 and 202, and prevent the transmission of visible light. For example, the light-blocking layers 260 are formed in a line pattern and extend along the lengths of the first and second edge sub-pixel lines 201 and 202. In particular, one of the light-blocking layers 260 covers the left edge of the first edge sub-pixel line 201 and another of the light-blocking layers 260 covers the right edge of the second edge sub-pixel line 202. Accordingly, the light-blocking layers 260 reduce the external emission widths of the edge sub-pixel lines 201 and 202.

Referring to FIG. 4, the openings 210a have widths that correspond to the widths of the first and second edge sub-pixel lines 201 and 202, and the widths of the first, second, and third center sub-pixel lines 251, 252, and 253. In this case, sub-pixel lines including sub-pixels of the same color have the same width, in both the edge portions 210 and the central portion 250.

That is, a width EA1 of the first edge sub-pixel line 201 is the same as a width CA1 of the third center sub-pixel lines 253, both of which including the red sub-pixels. In addition, a width EA2 of the second edge sub-pixel line 202 is the same as a width CA2 of the second center sub-pixel lines 252, both of which including the blue sub-pixels. The widths EA1, EA2, CA1, and CA2 are equal to the widths of the openings 110a corresponding thereto.

However, when a user views the organic light-emitting display apparatus 200, the user perceives that the edge sub-pixel lines 101 and 102 have smaller widths, due to being partially covered by the light-blocking layers 260. That is, an external emission width BA1 of the first edge sub-pixel line 201 is less than the width CA1 of the opening 210a of the third center sub-pixel line 253. In addition, an external emission width BA2 of the opening 210a of the second edge sub-pixel line 202 is less than the width CA2 of the opening 210a of the second center sub-pixel line 252.

The width of the light-blocking layers 260 may be modified to easily adjust the external emission widths of the sub-pixels of the edge portions 210. That is, when a user sees the organic light-emitting display apparatus 200, the user perceives that the external emission width BA1 of the first edge sub-pixel line 201 is less than the width CA1 of the third center sub-pixel lines 253 of the same color, and that the width BA2 of the second edge sub-pixel line 202 is less than the width CA2 of the second center sub-pixel lines 252 of the same color.

A sealing member (not shown) may be disposed on the substrate 205, that is, may be disposed on the upper surface of the opposite electrode 230. The sealing member protects the organic light-emitting layers from external moisture and/or oxygen and is formed of a transparent material. To this end, the sealing member may be formed of glass or plastic, or be formed of a stack of organic materials and/or inorganic materials.

According to the present exemplary embodiment, the external emission width BA1 of the first edge sub-pixel line 201 is less than the width CA1 of the third center sub-pixel lines 253 of the same color, due to the light-blocking layers 260. In addition, the external emission width BA2 of the second edge sub-pixel line 202 is less than the width CA2 of the second center sub-pixel lines 252 of the same color, due to the light-blocking layers 260. Accordingly, defects such as lines perceived at the left and right edges are prevented, to improve the picture quality of the organic light-emitting display apparatus 200.

Figure 5:
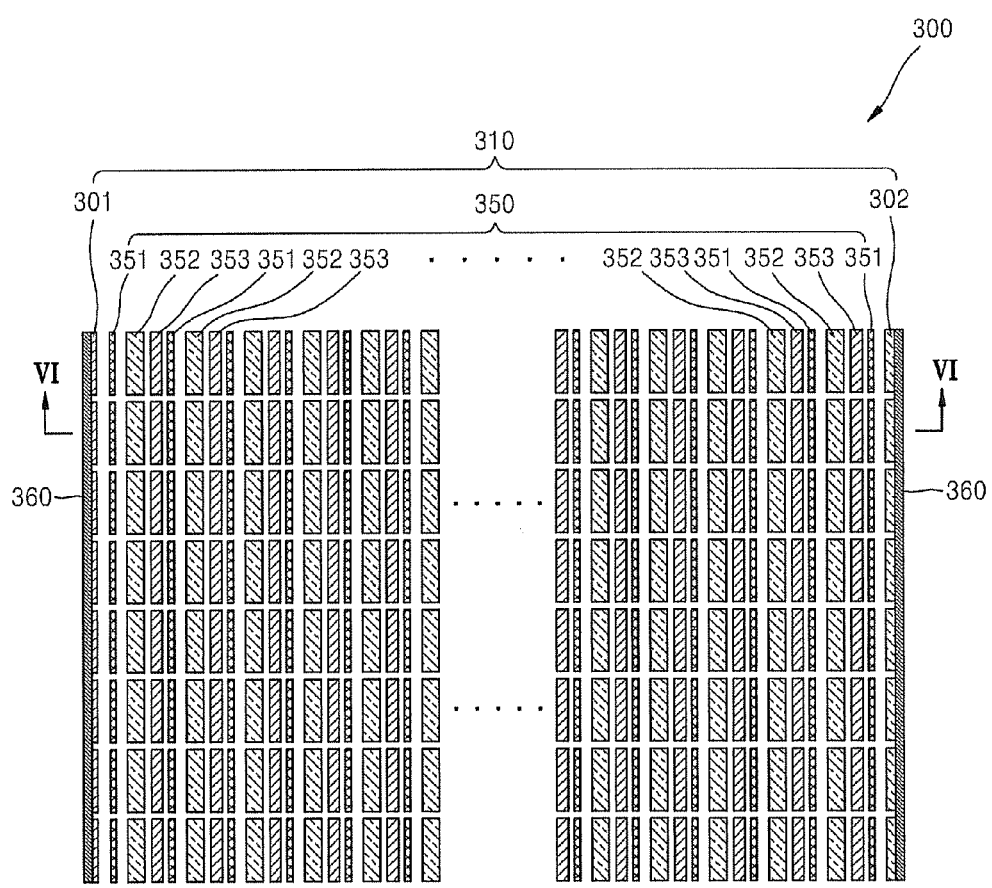
FIG. 5 illustrates a plan view of an organic light-emitting display apparatus, according to another exemplary embodiment of the present invention.
Figure 6:
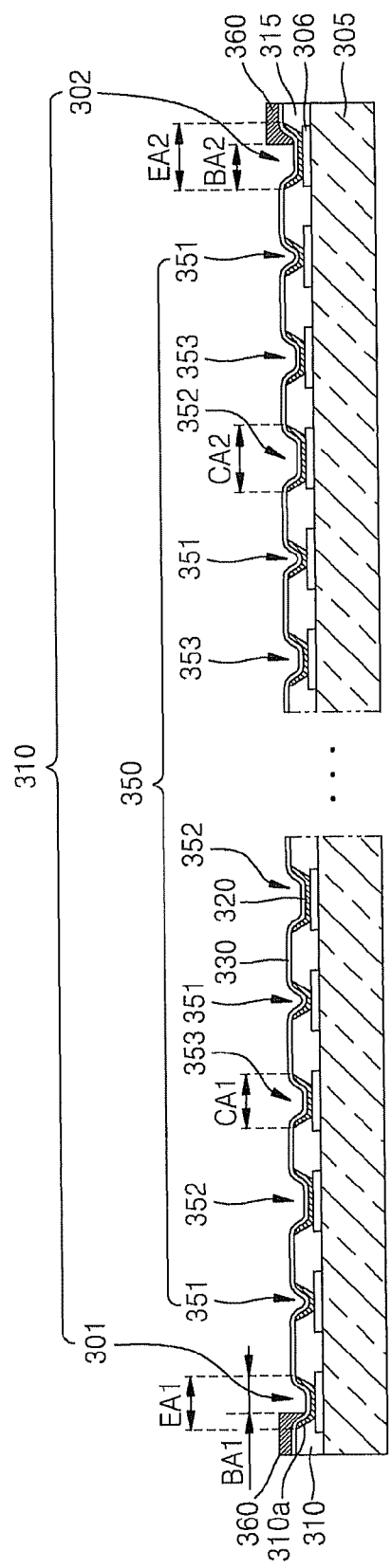
FIG. 6 illustrates a cross-sectional view taken along line VI-VI of FIG. 5.

FIG. 5 illustrates a plan view of an organic light-emitting display apparatus 300, according to another exemplary embodiment of the present invention. FIG. 6 illustrates a cross-sectional view taken along line VI-VI of FIG. 5. For convenience, elements different from those of the first and second previous embodiments will be principally described.

Referring to FIG. 5, the organic light-emitting display apparatus 300 includes edge portions 310 and a central portion 350. The edge portions 310 each include an auxiliary electrode layer 360 having a predetermined width.

The edge portions 310 include a first edge sub-pixel line 301 and a second edge sub-pixel line 302. The central portion 350 is disposed between the first and second edge sub-pixel lines 301 and 302. In detail, the first and second edge sub-pixel lines 301 and 302 are disposed at opposing sides of the display apparatus 300, from a user' perspective. That is, when a user sees the first and second edge sub-pixel lines 301 and 302, the first edge sub-pixel line 301 is disposed at the left edge, and the second edge sub-pixel line 302 is disposed at the right edge. The first and second edge sub-pixel lines 301 and 302 each include a plurality of sub-pixels.

The central portion 350 includes a plurality of sub-pixel lines, and particularly, may include a first center sub-pixel line 351, a second center sub-pixel line 352, and a third center sub-pixel line 353, which may be sequentially repeated in the stated order. Thus, a plurality of the first, second, and third center sub-pixel lines 351, 352, and 353 may be provided in the central portion 350.

The first and second edge sub-pixel lines 301 and 302, and the first, second, and third center sub-pixel lines 351, 352, and 353 each may include sub-pixels of the same color. In detail, the first edge sub-pixel line 301 includes red sub-pixels, the first center sub-pixel lines 351 include green sub-pixels, the second center sub-pixel lines 352 include blue sub-pixels, the third center sub-pixel lines 353 include red sub-pixels, and the second edge sub-pixel line 302 includes blue sub-pixels.

Referring to FIGS. 5 and 6, the first, second, and third center sub-pixel lines 351, 352, and 353 each include sub-pixels of the same color and the same width. That is, the widths of the first center sub-pixel lines 351 including the green sub-pixels are identical, the widths of the second center sub-pixel lines 352 including the blue sub-pixels are identical, and the widths of the third center sub-pixel lines 353 including the red sub-pixels are identical.

As illustrated in FIG. 5, the external emission width of the first edge sub-pixel line 301 is less than the width of the third center sub-pixel lines 353. The external emission width of the second edge sub-pixel line 302 is than the width of the second center sub-pixel lines 352.

The above-described configuration will now be described in detail with reference to FIG. 6. Referring to FIG. 6, the organic light-emitting display apparatus 300 includes a substrate 305, pixel electrodes 306, middle layers 320, an opposite electrode 330, and the auxiliary electrode layer 360.

The pixel electrodes 306 are formed on the substrate 305. A pixel-defining film 315 is formed on the pixel electrodes 306 and has a plurality of openings 310a to expose predetermined regions of the pixel electrodes 306. The pixel-defining film 315 may be formed of an organic material or an inorganic material.

The middle layers 320 are formed in the openings 310a. The middle layers 320 each include an organic emissive layer. In detail, the middle layer 320 formed in the first edge sub-pixel line 301 includes an organic light-emitting layer that emits red light. The middle layers 320 formed in the first center sub-pixel lines 351 include organic light-emitting layers that emit green light. The middle layers 320 formed in the second center sub-pixel lines 352 include organic light-emitting layers that emit blue light. The middle layers 320 formed in the third center sub-pixel lines 353 include organic light-emitting layers that emit red light. The middle layer 320 formed in the second edge sub-pixel line 302 includes an organic light-emitting layer that emits blue light.

The opposite electrode 330 is formed on upper surfaces of the middle layers 320. The opposite electrode 330 may cover the first and second edge sub-pixel lines 301 and 302, and the first, second, and third center sub-pixel lines 351, 352, and 353.

The auxiliary electrode layer 360 is formed on the opposite electrode 330, on the upper surfaces of the first and second edge sub-pixel lines 301 and 302. The auxiliary electrode layer 360 covers a predetermined width of the first and second edge sub-pixel lines 301 and 302, and is opaque. To this end, the auxiliary electrode layer 360 includes a light blocking material. In detail, the auxiliary electrode layer 360 is formed in a line pattern, in the longitudinal direction of the first and second edge sub-pixel lines 301 and 302, and covers the left edge of the first edge sub-pixel line 301 and the right edge of the second edge sub-pixel line 302.

Referring to FIG. 6, the openings 310a have widths that correspond to the widths of the first and second edge sub-pixel lines 301 and 302 and the widths of the first, second, and third center sub-pixel lines 351, 352, and 353. In this case, sub-pixel lines of the same color have the same width, in both the edge portions 310 and the central portion 350.

That is, an emission width EA1 of the first edge sub-pixel line 301 is the same as a width CA1 of the third center sub-pixel lines 353. In addition, a width EA2 of the second edge sub-pixel line 302 is the same as an emission width CA2 of the second center sub-pixel lines 352. The widths EA1, EA2, CA1, and CA2 are equal to the widths of the openings 110a corresponding thereto, and may be referred to as emission widths.

However, the edge portions 310 have external emission widths that are smaller than the emission widths thereof. That is, the first edge sub-pixel line 301 has an external emission width BA1 (width of the portion that is not covered with the auxiliary electrode layer 360) that is less than the width CA1 of the third center sub-pixel lines 353. In addition, the second edge sub-pixel line 302 has an external emission width BA2 (width of the portion that is not covered with the auxiliary electrode layer 360) that is less than the emission width CA2 of the second center sub-pixel lines 352. The widths CA1 and CA2 (emission widths) are also the external emission widths of the corresponding center sub-pixel lines, since they are not covered by a light-blocking material.

The width of the auxiliary electrode layer 360 may be modified to easily adjust the external emission widths of the sub-pixels of the edge portions 310. That is, when a user sees the organic light-emitting display apparatus 300, the user perceives that the width BA1 is less than the width CA1, and that the width BA2 is less than the width CA2.

A sealing member (not shown) may be disposed on the substrate 305, that is, may be disposed on the upper surface of the opposite electrode 330. The sealing member protects the organic light-emitting layers from external moisture and/or oxygen and is formed of a transparent material. To this end, the sealing member may be formed of glass or plastic, or be formed of stacked organic materials and/of inorganic materials.

According to the present embodiment, the external emission width BA1 of the first edge sub-pixel line 301 is less than both the emission width EA1 thereof, and the emission width CA1 of the third center sub-pixel lines 353, which have the same color, because the auxiliary electrode layer 360 configured to block light. In addition, the external emission width BA2 is less than the emission width EA2 thereof, and the emission CA2 of the second center sub-pixel lines 352 having the same color.

Accordingly, defects such as lines perceived at the left and right edges of the display apparatus 300 are prevented, to improve the picture quality thereof. In addition, the auxiliary electrode layer 360 is formed on the opposite electrode 330, to prevent the degradation of picture quality due to a voltage drop.

Figure 7:
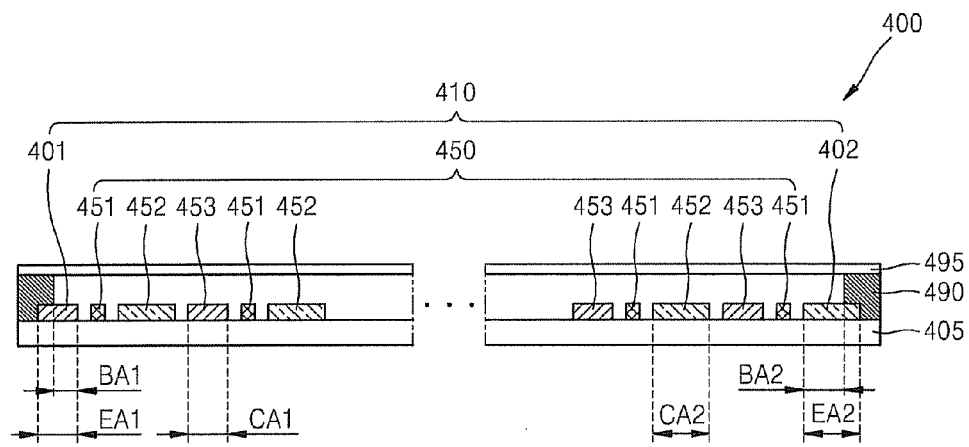
FIG. 7 illustrates a cross-sectional view of an organic light-emitting display apparatus, according to another embodiment of the present invention.

FIG. 7 is a cross-sectional view illustrating an organic light-emitting display apparatus 400, according to another exemplary embodiment of the present invention. For convenience, elements different from those of the first, second, and third previous embodiments will be principally described. Referring to FIG. 7, the organic light-emitting display apparatus 400 includes edge portions 410 and a central portion 450.

The edge portions 410 and the central portion 450 are disposed between a substrate 405 and a sealing member 495. The substrate 405 is attached to the sealing member 495 with a sealing material 490 that is formed on predetermined regions of the edge portions 410.

The edge portions 410 include a first edge sub-pixel line 401 and a second edge sub-pixel line 402. The central portion 450 is disposed between the first and second edge sub-pixel lines 401 and 402.

In detail, the first and second edge sub-pixel lines 401 and 402 are disposed at opposing side edges of the display apparatus 400, from a user's perspective. That is, when a user sees the first and second edge sub-pixel lines 401 and 402, the first edge sub-pixel line 401 is disposed at the left edge, and the second edge sub-pixel line 402 is disposed at the right edge. The first and second edge sub-pixel lines 401 and 402 each may include a plurality of sub-pixels.

The central portion 450 includes a plurality of sub-pixel lines, and particularly, may include a first center sub-pixel line 451, a second center sub-pixel line 452, and a third center sub-pixel line 453, which may be sequentially repeated in the stated order. Thus, a plurality of the first, second, and third center sub-pixel lines 451, 452, and 453 may be provided in the central portion 450.

The first and second edge sub-pixel lines 401 and 402, and the first, second, and third center sub-pixel lines 451, 452, and 453 each may include sub-pixels of the same color. In detail, the first edge sub-pixel line 401 includes red sub-pixels, the first center sub-pixel lines 451 include green sub-pixels, the second center sub-pixel lines 452 include blue sub-pixels, the third center sub-pixel lines 453 include red sub-pixels, and the second edge sub-pixel line 402 includes blue sub-pixels.

Referring to FIG. 7, the first, second, and third center sub-pixel lines 451, 452, and 453 of the same color have the same width. That is, the emission widths of the first center sub-pixel lines 451 are identical, the emission widths of the second center sub-pixel lines 452 are identical, and the emission widths of the third center sub-pixel lines 453 are identical.

As illustrated in FIG. 7, an emission width BA1 of the first edge sub-pixel line 401 is less than both an emission width EA1 thereof, and a width CA1 of the third center sub-pixel lines 453. In addition, an emission width BA2 of the second edge sub-pixel line 402 is less than both the width EA2 thereof, and a width CA2 of the second center sub-pixel lines 452.

In detail, the sealing material 490 is disposed on the upper surface of the first edge sub-pixel line 401 and on the upper surface of the second edge sub-pixel line 402. The sealing material 490 covers a predetermined width of the first and second edge sub-pixel lines 401 and 402, and is opaque. That is, the sealing material 490 contacts the substrate 405 and the sealing member 495, the first edge sub-pixel line 401 and the second edge sub-pixel line 402, to attach the substrate 405 to the sealing member 495. The sealing material 490 includes a light blocking material. The sealing material 490 is formed in a line pattern, in the longitudinal direction of the first and second edge sub-pixel lines 401 and 402, and covers the left edge of the first edge sub-pixel line 401 and the right edge of the second edge sub-pixel line 402.

Referring to FIG. 7, the edge sub-pixel lines 401 and 402, and the center sub-pixel lines 451, 452, and 453 of the same colors have the same emission widths, in both the edge portions 410 and the central portion 450. That is, the emission width EA1 of the first edge sub-pixel line 401 is the same as the emission width CA1 of the third center sub-pixel lines 453. In addition, the emission width EA2 of the second edge sub-pixel line 402 is the same as the emission width CA2 of the second center sub-pixel lines 452.

However, the external emission widths of the edge sub-pixel lines 410 and 402 are smaller than the emission widths thereof. That is, the external emission width BA1 corresponds to a region of the first edge sub-pixel line 401 is not covered with the sealing material 490 and is less than the emission width CA1 of the third center sub-pixel lines 453. In addition, the external emission width BA2 of the second edge sub-pixel line 402 is less than the emission width CA2 of the second center sub-pixel lines 452.

The width of the sealing material 490 may be modified to easily adjust the external emission widths of the sub-pixels of the edge portions 410. That is, when a user sees the organic light-emitting display apparatus 400, the external emission width BA1 of the first edge sub-pixel line 401 is less than the width CA1 of the third center sub-pixel lines 453, and the external emission width BA2 is less than the width CA2 of the second center sub-pixel lines 452.

According to the present embodiment, the sealing material 490 blocks light, such that external emission width BA1 of the first edge sub-pixel line 401 is less than the width CA1 of the third center sub-pixel lines 453, which have the same color as the first edge sub-pixel line 401. In addition, external emission width BA2 of the second edge sub-pixel line 402 is less than the width CA2 of the second center sub-pixel lines 452 having the same color as that of the second edge sub-pixel line 402. Accordingly, defects such as lines perceived at the left and right edges of the display apparatus 400 are prevented, to improve the picture quality thereof.

Figure 8:
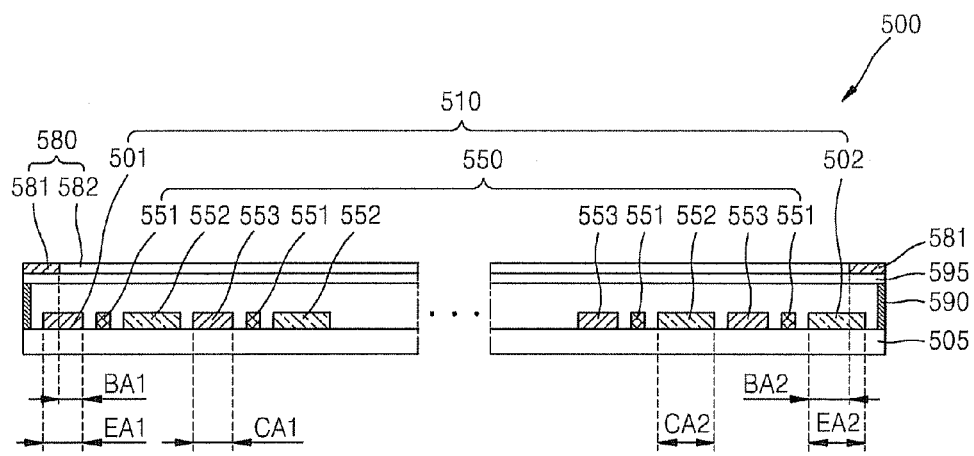
FIG. 8 illustrates a cross-sectional view of an organic light-emitting display apparatus according to another exemplary embodiment of the present invention.

FIG. 8 is a cross-sectional view illustrating an organic light-emitting display apparatus 500, according to another exemplary embodiment of the present invention. For convenience, elements different from those of the first, second, third, and fourth previous embodiments will be principally described. Referring to FIG. 8, the organic light-emitting display apparatus 500 includes edge portions 510 and a central portion 550.

The edge portions 510 and the central portion 550 are disposed between a substrate 505 and a sealing member 595. The substrate 505 is attached to the sealing member 595 with a sealing material 590. A polarization unit 580 is disposed on the sealing member 595. The polarization unit 580 includes first polarization members 581 and a second polarization member 582.

The edge portions 510 include a first edge sub-pixel line 501 and a second edge sub-pixel line 502. The central portion 550 is disposed between the first and second edge sub-pixel lines 501 and 502. The central portion 550 may include a first center sub-pixel line 551, a second center sub-pixel line 552, and a third center sub-pixel line 553. The edge portions 510 and the central portion 550 are similar to corresponding elements described in FIGS. 6 and 7, and will not be described in detail.

As illustrated in FIG. 8 an external emission width BA1 of the first edge sub-pixel line 501 is less than a width CA1 of the third center sub-pixel lines 553. An external emission width BA2 of the second edge sub-pixel line 502 is less than a width CA2 of the second center sub-pixel lines 552. In detail, the first polarization member 581 covers portions of the first edge sub-pixel line 501 and the second edge sub-pixel line 502, so as to form the external emission widths BA1 and BA2. Since the center sub-pixel lines 551-553 are not covered, the widths thereof are external emission widths.

The first polarization members 581 have lower light transmissivity than the second polarization member 582. The first polarization member 581 is formed to cover a predetermined width of the first and second edge sub-pixel lines 501 and 502, and prevents the transmission of visible light.

That is, the polarization unit 580 is disposed on the sealing member 595, and the first polarization members 581 are disposed to cover predetermined regions of the first and second edge sub-pixel line 501 and 502. The second polarization member 582 is disposed to cover the rest of the sealing member 595. That is, the second polarization member 582 covers the central portion 550 and predetermined regions of the edge portions 510. The first polarization members 581 may include a light blocking material to emitted light. The first polarization members 581 are formed in line patterns extending along the lengths of the first and second edge sub-pixel lines 501 and 502. The first polarization members 581 cover the left edge of the first edge sub-pixel line 501 and the right edge of the second edge sub-pixel line 502.

Referring to FIG. 8, a width EA1 of the first edge sub-pixel line 501 is the same as the width CA1 of the third center sub-pixel lines 553. In addition, a width EA2 of the second edge sub-pixel line 502 is the same as the width CA2 of the second center sub-pixel lines 552.

However, the edge portions 510 have smaller external emission widths. That is, the external emission widths BA1 and BA2 are smaller than the widths CA1 and CA2, respectively.

The width of the first polarization member 581 may be modified to easily adjust the external emission widths of the sub-pixels of the edge portions 510. That is, the external emission width BA1 of the first edge sub-pixel line 501 is less than the width CA1 of the third center sub-pixel lines 553. The external emission width BA2 of the second edge sub-pixel line 502 is less than the width CA2 of the second center sub-pixel lines 552.

Accordingly, the external emission widths BA1 and BA2 are less than the emission widths CA1 and CA2, due to the first polarization member 581 being configured to block light. Accordingly, defects such as lines perceived at the left and right edges are prevented, to improve the picture quality of the organic light-emitting display apparatus 500.

Figure 9:
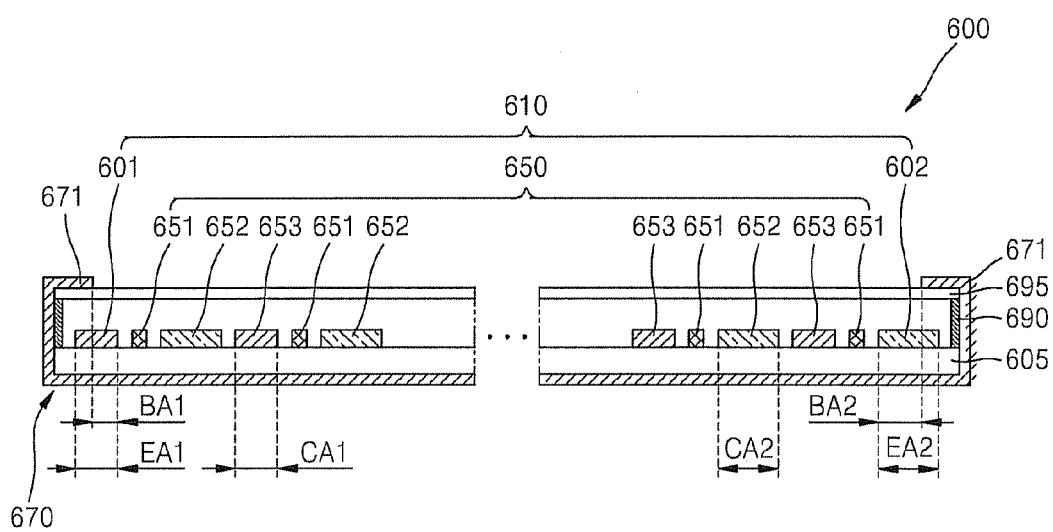
FIG. 9 illustrates a cross-sectional view of an organic light-emitting display apparatus, according to another exemplary embodiment of the present invention.

FIG. 9 illustrates a cross-sectional view illustrating an organic light-emitting display apparatus 600, according to another exemplary embodiment of the present invention. For convenience, element different from those of the first, second, third, fourth, and fifth previous embodiments will be principally described. Referring to FIG. 9, the organic light-emitting display apparatus 600 includes edge portions 610 and a central portion 650.

The edge portions 610 and the central portion 650 are disposed between a substrate 605 and a sealing member 695. The substrate 605 is attached to the sealing member 695 with a sealing material 690. The substrate 605 and the sealing member 695 are fitted in a bezel 670 to reinforce the same. The bezel 670 includes protrusions 671 that cover portions of the edge portions 610.

The edge portions 610 include a first edge sub-pixel line 601 and a second edge sub-pixel line 602. The central portion 650 is disposed between the first and second edge sub-pixel lines 601 and 602

The central portion 650 includes a plurality of first center sub-pixel lines 651, second center sub-pixel lines 652, and third center sub-pixel lines 653. The edge portions 610 and the central portion 650 are similar to corresponding elements described in FIGS. 6 and 7, and will not be described in detail.

As illustrated in FIG. 9, an external emission width BA1 of the first edge sub-pixel line 601 is less than a width CA1 of the third center sub-pixel lines 653, and an external emission width BA2 of the second edge sub-pixel line 602 is less than a width CA2 of the second center sub-pixel lines 652. In detail, the protrusions 671 of the bezel 670 cover portions of the first and second edge sub-pixel line 601 and 602. The widths CA1 and CA2 may be referred to as emission widths, since the corresponding sub-pixel lines are not covered with a light-blocking material.

The bezel 670 reinforces the substrate 605 and the sealing member 695. In detail, the substrate 605 is attached to the sealing member 695 with the sealing material 690, and then, the substrate 605 and the sealing member 695 are fitted in the bezel 670 that includes the protrusions 671 adjacent to the sealing member 695. The protrusions 671 cover portions of the first and second edge sub-pixel lines 601 and 602. The protrusions 671 prevent the transmission of visible light therethrough.

That is, the protrusions 671 are disposed on the sealing member 695, in predetermined regions at the upper surfaces of the first and second edge sub-pixel lines 601 and 602. The protrusions 671 are formed in line patterns, in the longitudinal direction of the first and second edge sub-pixel lines 601 and 602. The protrusions 671 cover the left edge of the first edge sub-pixel line 601 and the right edge of the second edge sub-pixel line 602.

Referring to FIG. 9, sub-pixel lines including sub-pixels of the same color have the same width in both the edge portions 610 and the central portion 650. That is, a width EA1 of the first edge sub-pixel line 601 including the red sub-pixels is the same as the width CA1 of the third center sub-pixel lines 653 including the red sub-pixels. In addition, a width EA2 of the second edge sub-pixel line 602 is the same as the width CA2 of the second center sub-pixel lines 652.

However, an external emission width BA1, which corresponds to a region that is not covered with the protrusion 671, is less than the width CA1 of the third center sub-pixel line 653. In addition, the external emission width BA2 is less than the width CA2 of the second center sub-pixel line 652.

The width of the protrusions 671 may be modified to easily adjust the external emission widths of the sub-pixels of the edge portions 610. That is, when a user sees the organic light-emitting display apparatus 600, the external emission width BA1 of the first edge sub-pixel line 601 is less than the width CA1 of the third center sub-pixel lines 653 including the red sub-pixels. The width BA2 of the second edge sub-pixel line 602 is less than the width CA2 of the second center sub-pixel lines 652 including the blue sub-pixels.

According to aspects of the present exemplary embodiment, the protrusions 671 of the bezel 670 block light, such that the external emission widths BA1 and BA2 are smaller than the emission widths CA1 and CA2. Accordingly, defects such as lines perceived at the left and right edges are prevented, to improve the picture quality of the organic light-emitting display apparatus 600. An organic light-emitting display apparatus according to the present invention easily achieves improvements in picture quality characteristics.

While the present invention has been particularly shown and described with reference to exemplary embodiments thereof, it will be understood by those of ordinary skill in the art that various changes in form and details may be made therein, without departing from the spirit and scope of the present invention, as defined by the following claims.

What is claimed is:

1. An organic light-emitting display apparatus comprising:
    sub-pixel lines disposed in parallel, each of the sub-pixel lines being configured to emit light of a single color, the sub-pixel lines comprising:
        first and second edge sub-pixel lines disposed at opposing side edges of the apparatus; and
        center sub-pixel lines disposed between the edge sub-pixel lines, wherein,
    the external emission width of each of the edge sub-pixel lines, which is a width-wise distance along which light is emitted from a corresponding one of the sub-pixel lines and transmitted out of the display apparatus, is less than the external emission width of the center sub-pixel lines that emit the same color of light as a corresponding one of the first and second edge sub-pixel lines.

2. The apparatus of claim 1, wherein the sub-pixel lines each comprise sub-pixels disposed in a linear arrangement.

3. The apparatus of claim 1, further comprising:
    a substrate to support the sub-pixel lines;
    a pixel-defining film disposed on the substrate, having openings formed therein, wherein, the sub-pixel lines comprise:
        pixel electrodes disposed on the substrate facing the openings;
        organic light-emitting layers disposed in the openings, electrically connected to the pixel electrodes; and
        an opposite electrode disposed on the light-emitting layers,
    the width of the openings corresponding to the first edge sub-pixel line is less than the width of the openings corresponding to the center sub-pixel lines that emit the same color of light, and
    the width of the openings corresponding to the second edge sub-pixel line is less than the width of the openings corresponding to the center sub-pixel lines that emit the same color of light.

4. The apparatus of claim 1, further comprising light-blocking layers partially covering the first and second edge sub-pixel lines.

5. The apparatus of claim 4, wherein the light-blocking layers extend linearly along the lengths of the first and second edge sub-pixel lines.

6. The apparatus of claim 4, wherein the light-blocking layers cover outermost side of the first and second edge sub-pixel lines.

7. The apparatus of claim 1, further comprising:
    a substrate to support the sub-pixel lines; and
    auxiliary electrode layers partially covering the edge sub-pixel lines, wherein the edge and center sub-pixel lines comprise:
        pixel electrodes;
        organic light-emitting layers; electrically connected to the pixel electrodes; and
        an opposite electrode disposed on the light-emitting layers.

8. The apparatus of claim 7, wherein the auxiliary electrode layers comprise a light blocking material.

9. The apparatus of claim 7, wherein the auxiliary electrode layers extend linearly along the lengths of the edge sub-pixel lines.

10. The apparatus of claim 7, wherein the auxiliary electrode layers cover the outermost sides of the edge sub-pixel lines.

11. The apparatus of claim 1, further comprising:
    a substrate to support the sub-pixel lines;
    a sealing member; and
    a sealing material to attach the substrate to the sealing member,
    wherein the sealing material covers a portion of the edge sub-pixel lines.

12. The apparatus of claim 11, wherein the sealing material comprises a light blocking material.

13. The apparatus of claim 11, wherein the sealing material is formed in a line pattern extending along the lengths of the edge sub-pixel lines.

14. The apparatus of claim 11, wherein the sealing material covers outermost sides of the edge sub-pixel lines.

15. The apparatus of claim 1, further comprising:
    a substrate to support the edge and center sub-pixel lines;
    a sealing member disposed on the edge and center sub-pixel lines;
    first polarization members disposed on the sealing member, covering portions of the edge sub-pixel lines; and
    a second polarization member disposed on the sealing member, between the first polarization members,
    wherein the first polarization members have a lower light transmissivity than the second polarization member.

16. The apparatus of claim 15, wherein the first polarization members comprise a light blocking material.

17. The apparatus of claim 15, wherein the first polarization members extend linearly along the lengths of the edge sub-pixel lines.

18. The apparatus of claim 15, wherein the first polarization members overlap outermost sides of the first and second edge sub-pixel lines.

19. The apparatus of claim 1, further comprising:
    a substrate to support the edge and center sub-pixel lines;
    a sealing member disposed on the substrate; and
    a bezel to reinforce the substrate and the sealing member, comprising protrusions covering a portion of the edge sub-pixel lines.

20. The apparatus of claim 19, wherein the protrusions extend along the lengths of the edge sub-pixel lines.

21. The apparatus of claim 19, wherein the protrusions cover outermost sides of the edge sub-pixel lines.

* * * * *